(12) United States Patent
Lai et al.

(10) Patent No.: US 9,704,986 B2
(45) Date of Patent: Jul. 11, 2017

(54) VDMOS HAVING SHIELDING GATE ELECTRODES IN TRENCHES AND METHOD OF MAKING THE SAME

(71) Applicant: International Onizuka Electronics Limited, Hong Kong (HK)

(72) Inventors: Mau Lam Lai, Hong Kong (HK); Yeuk Yin Mong, Hong Kong (HK); Duc Quang Chau, HongKong (HK)

(73) Assignee: International Onizuka Electronics Limited, Hong Kong (HK)

( * ) Notice: Subject to any disclaimer, the term of this patent is extended or adjusted under 35 U.S.C. 154(b) by 0 days.

(21) Appl. No.: 15/181,186

(22) Filed: Jun. 13, 2016

(65) Prior Publication Data

US 2017/0104095 A1  Apr. 13, 2017

(51) Int. Cl.

| | |
|---|---|
| *H01L 29/78* | (2006.01) |
| *H01L 29/08* | (2006.01) |
| *H01L 29/10* | (2006.01) |
| *H01L 29/40* | (2006.01) |
| *H01L 29/423* | (2006.01) |
| *H01L 29/66* | (2006.01) |
| *H01L 29/417* | (2006.01) |

(52) U.S. Cl.
CPC ...... *H01L 29/7813* (2013.01); *H01L 29/0865* (2013.01); *H01L 29/0878* (2013.01); *H01L 29/1079* (2013.01); *H01L 29/404* (2013.01); *H01L 29/407* (2013.01); *H01L 29/4236* (2013.01); *H01L 29/66734* (2013.01); *H01L 29/7802* (2013.01); *H01L 29/7811* (2013.01); *H01L 29/1095* (2013.01); *H01L 29/41766* (2013.01)

(58) Field of Classification Search
CPC ............. H01L 29/7802; H01L 29/7813; H01L 29/4236; H01L 29/1095; H01L 29/66734
See application file for complete search history.

(56) References Cited

U.S. PATENT DOCUMENTS

| | | | |
|---|---|---|---|
| 8,829,607 B1 * | 9/2014 | Hsieh ................ | H01L 29/41766 257/329 |
| 2014/0374842 A1* | 12/2014 | Weber .................. | H01L 29/404 257/409 |
| 2015/0349091 A1* | 12/2015 | Yilmaz ............. | H01L 29/66666 438/270 |
| 2016/0300913 A1* | 10/2016 | Siemieniec ........... | H01L 29/407 |

\* cited by examiner

*Primary Examiner* — Michael Jung
(74) *Attorney, Agent, or Firm* — Wayne & King LLC

(57) ABSTRACT

A VDMOS includes a substrate; an epitaxial layer; first and second trenches defined in the epitaxial layer; a shielding gate and a control gate formed in the trenches; a body region formed at the epitaxial layer and between the first and second trenches; a N+ source region formed at the body region; a distinct doping region formed in the epitaxial layer underneath the body region, extending towards bottoms of the trenches; a channel defined between the N+ source region and epitaxial layer adjacent to the trenches; an insulating layer defining a contact hole extending into the body region and the first trench; a P+ body pickup region formed in the body region corresponding to the contact hole; and a metal layer having a butting contact filled in the contact hole, connecting the N+ source region, P+ body pickup region, and control gate and/or shielding gate in the first trench.

16 Claims, 15 Drawing Sheets

VDMOS HAVING SHIELDING GATE ELECTRODES IN TRENCHES AND METHOD OF MAKING THE SAME

CROSS-REFERENCE TO RELATED APPLICATIONS

This application claims the priority benefit of a Hong Kong patent application No. 15109769.3, filed on Oct. 7, 2015. The content of the aforementioned application, including any intervening amendments thereto, is incorporated herein by reference

FIELD OF THE INVENTION

The present invention relates to VDMOS (vertical double-diffusion metal-oxide-semiconductor) for power management applications, and more particularly to a method for making the VDMOS.

BACKGROUND OF THE INVENTION

Generally a VDMOS has the source thereof placed over the drain, resulting in a current mainly vertical when it is on. The VDMOS has advantages of easy to drive, high commutation speed, and good efficiency at low voltages, and is widely used as switch in power management application, such as DC/DC converter and load switch. Power loss in the VDMOS is the key contribution to the overall efficiency of the circuit. The major parameters relate to the power loss are on-resistance and gate charge of the VDMOS. It would be beneficial if VDMOS having improved designs are provided.

SUMMARY OF THE INVENTION

For the defects in the art, an object of the present invention is to provide a VDMOS with reduced resistance and capacitance, and a method for making such VDMOS.

According to one aspect, the present invention provides a VDMOS which includes: a heavily doped substrate acting as a drain; an epitaxial layer formed on the substrate; first and second types of trenches being defined in the epitaxial layer, the first type of trench and the second type of trench sitting side by side; a shielding gate formed in the first and second types of trenches; a body region formed at the surface of the epitaxial layer and between the first and second types of trenches; a N+ source region formed at the surface of the body region; a distinct doping region formed in the epitaxial layer underneath the body region, the distinct doping region extending towards bottoms of the first and second types of trenches, and having an impurity concentration higher than the epitaxial layer; a channel being defined between the N+ source region and epitaxial layer adjacent to the trenches; an insulating layer covering the epitaxial layer and the trenches, at least one contact hole extending through the insulating layer and the N+ source region into the body region and the first type of trench; a P + body pickup region formed in the body region corresponding to the at least one contact hole; and a metal layer formed on the insulating layer, the metal layer having at least one butting contact filled in the at least one contact hole, the butting contact connecting the N+ source region, the P+ body pickup region, and the first type of trench.

Preferably, a control gate is formed in the second type of trench, the control gate is over the shielding gate, and an insulating oxide layer is formed between the control gate and shielding gate in the second type of trench.

Preferably, a control gate is formed in the first type of trench over the shielding gate, and an insulating oxide layer is formed between the control gate and shielding gate in the first type of trench, the at least one butting contact connecting the control gate in the first type of trench.

Preferably, a control gate is formed in the first type of trench over the shielding gate, and the control gate and shielding gate in the first type of trench connect together, the at least one butting contact connecting the control gate and shielding gate in the first type of trench.

Preferably, the shielding gate in the first type of trench fills up the first type of trench from the bottom of the mouth of the first type of trench and connect the insulating layer, the at least one butting contact connecting the shielding gate in the first type of trench.

Preferably, an insulating oxide layer is formed in the first type of trench and over the shielding gate, the at least one butting contact connecting the insulating oxide layer in the first type of trench.

According to another aspect, the present invention provides a method for making the above VDMOS which includes: providing a heavily doped substrate acting as a drain; forming an epitaxial layer grown on the substrate; forming first and second types of trenches in the epitaxial layer, the first type of trench being spaced from second type of trench; forming a shielding gate at bottoms of the first and second types of trenches and a control gate at tops of the first and second types of trenches; forming a body region in the epitaxial layer between the first and second types of trenches; forming a distinct doping region underneath the body region and extend towards the bottoms of the trenches; forming a N+ source region at the surface of the body region; forming a channel between the N+ source region and epitaxial layer adjacent to the control gate; forming an insulating layer to cover the epitaxial layer and the trenches; forming at least one contact hole in the insulating layer corresponding to the first type of trench, the at least one contact hole extending into the body region and the control gate in the first trench; forming a P+ body pickup region in the body region facing to the first type of trench; and forming a metal layer on the insulating layer, the metal layer filling the at least one contact hole and connecting the N+ source region, P+ body pickup region, and control gate in the first type of trench together.

Preferably, further comprises forming an insulating layer on the shielding gate before forming the control gate.

Preferably, the insulating layer in the first type of trench is then removed before forming the control gate, and the control gate connects the shielding gate in the first type of trench.

Preferably, the distinct doping region is formed after formation of the body region.

Preferably, the distinct doping region is formed before formation of the first and second types of trenches.

For the present VDMOS, the charge coupling effect at the distinct doping region between trenches is much more effective, and thus the electric field is further reduced. Implementing a distinct doping profile such as linearly doping profile in the distinct doing region provides a uniform and optimum electric field. As a result, highest breakdown voltage can be obtained. Since the impurity concentration at the distinct doping region is much higher than the impurity concentration at the epitaxial layer, the Ron of the present VDMOS is further reduced.

DETAILED DESCRIPTION OF THE INVENTION

Figure 1:
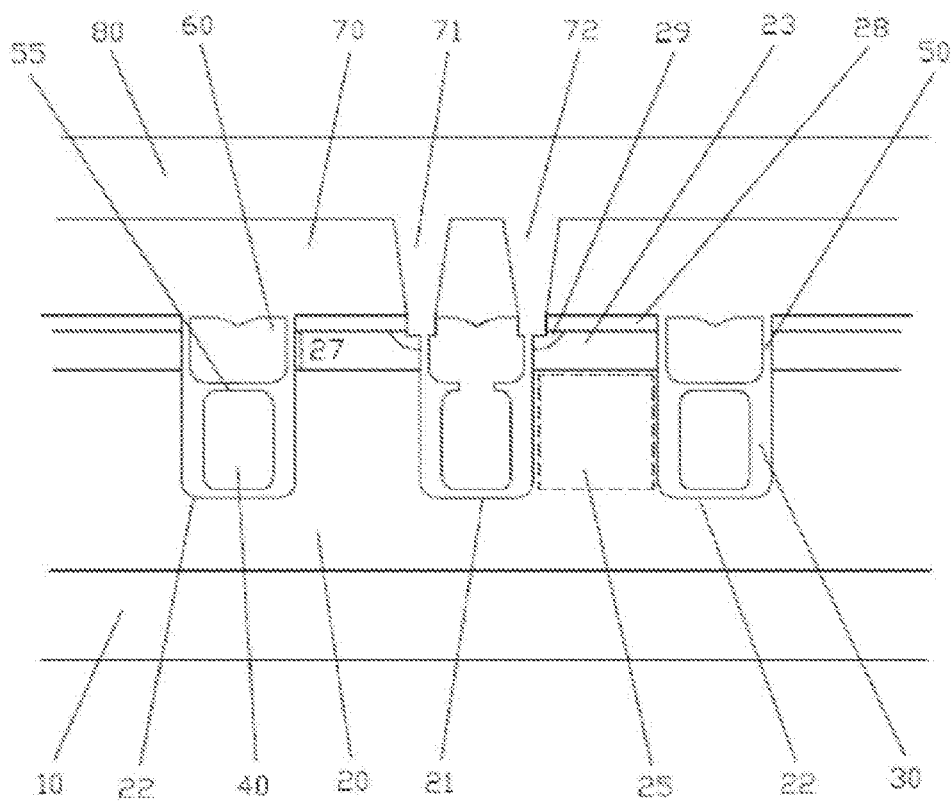
FIG. 1 is a schematic view of a VDMOS according to a first embodiment of the present invention.

The present invention will now be more particularly described, by way of example only, with reference to the accompanying drawings. It should be understood that the drawing are for better understanding and should not limit the present invention. Dimensions of components and features shown in the drawings are generally chosen for convenience and clarity of presentation and are not necessarily shown to scale.

Referring to FIG. 1, a VDMOS according to first embodiment of the present invention includes a substrate 10 and an epitaxial layer 20 grown on the substrate 10. The substrate 10 acts as a drain of the VDMOS, which is N-type semiconductor and heavily doped. The epitaxial layer 20 is N-type semiconductor and lightly doped. A thickness of the epitaxial layer 20 is usually 5-20 μm.

Figure 15:
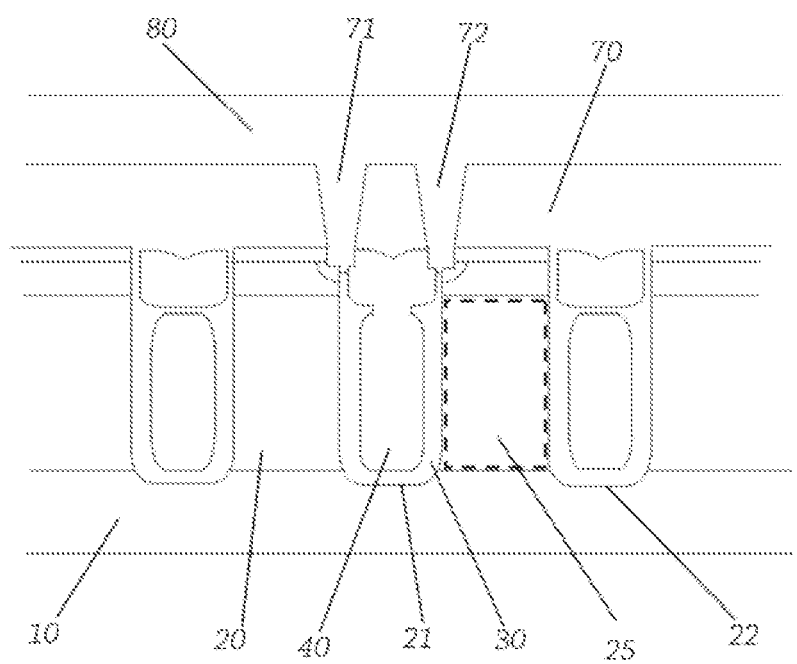
FIG. 15 shows a sixth embodiment of the VDMOS.

Trenches 21, 22 are defined in the epitaxial layer 20. In this embodiment, the trenches include two types of trenches 21 and 22. These two types of trenches 21, 22 are sitting side by side and spaced from each other. Each of the trenches 21, 22 has a width of 0.8-3 μm. A depth of the trenches 21, 22 can be less than the thickness of the epitaxial layer 20, and thus the trenches 21, 22 are totally inside the epitaxial layer 20, as shown in FIG. 1. Alternately, as shown in FIG. 15, the trenches 21, 22 can extend into the substrate 10 through the epitaxial layer 20.

A thick oxide layer 30 is formed in the trenches 21, 22, and covers bottom portions of sidewalls of the trenches 21, 22. A surface of the thick oxide layer 30 is thus lower than that of the epitaxial layer 20. A first conductive layer 40, such as polysilicon, fills up bottoms of the trenches 21, 22. The first conductive layer 40 acts as a shielding gate of the VDMOS. A surface of the shielding gate 40 is lower than that of the epitaxial layer 20. The thick oxide layer 30 surrounds the shielding gate 40. Preferably, the surface of the shielding gate 40 is not lower than that of the thick oxide layer 30.

An optional oxide layer 55 is formed on the surface of the shielding gate 40 in the trenches 21 and 22. A gate oxide layer 50 is covered on top portions of the sidewalls of the trenches 21, 22 and the top of the shielding gate 40 in the trenches 21 and 22. A second conductive layer 60 fills up the tops of the trenches 21, 22, acting as a control gate of the present VDMOS. The control gate 60 is etched back until a surface thereof being lower than that of the epitaxial layer 20. In this embodiment, the surface of the control gate 60 is concave.

In the second type of trench 22, the control gate 60 is insulated from the shielding gate 40 by the oxide layers 55 and 50. While, in the first type of trench 21, the shielding gate 40 and the control gate 60 are connected directly by removing the oxide layers 55 and 50.

A body region 23 is formed at the surface of the epitaxial layer 20 between the trenches 21, 22. Along a horizontal direction, the body region 23 is aligned with the control gate 60. Generally, the body region 23 is P-type, and has a doping concentration higher than that of the epitaxial layer 20. In this embodiment, a thickness of the body region 23 is less than that of the control gate 60. That is, a junction of the body region 23 to the epitaxial layer 20 is not lower than a bottom of the control gate 60, as viewed along a vertical direction.

A distinct doping region 25 is formed in the epitaxial layer 20 under the body region 23. The distinct doping region 25 is between the trenches 21, 22, and extends from the junction of the body region 23 towards the bottoms of the trenches 21, 22. Preferably, the distinct doping region 25 has a bottom above that of the trenches 21, 22. An impurity concentration at the distinct doping region 25 is much higher than that of the epitaxial layer 20. Implementing a specific impurity profile, such as linearly doping profile, in the distinct doping region 25, a uniform electric field distribution can be achieved.

For the present VDMOS, the charge coupling effect at the distinct doping region 25 between trenches 21, 22 is much more effective, and thus the electric field is further reduced. Implementing a distinct doping profile such as linearly doping profile in this distinct doing region provides a uniform and optimum electric field. As a result, highest breakdown voltage can be obtained. Since the impurity concentration at the distinct doping region 25 is much higher than the impurity concentration at the epitaxial layer 20, the Ron of the present VDMOS is further reduced.

A heavily doped N+ source region 28 is formed at the surface of the body region 23 between the trenches 21, 22. A channel 27 is thus formed between the N+ source region 28 and the epitaxial layer 20, adjacent to the control gate 60 of the second type of trench 22. The channel 27 formation is controlled by the control gate 60.

An insulating layer 70 is formed on the surface of the epitaxial layer 20 and covers the trenches 21, 22. The insulating layer 70 is usually composite of USG (Undoped Silicate Glass) and BPSG (Borophosphosilicate glass). Two contact holes 71 and 72 are defined in the insulating layer 70 corresponding to opposite lateral sides of the first type of trench 21, respectively. The contact holes 71 and 72 each extend through the insulating layer 70 and the N+ source region 28, into the body region 23 and a lateral of the control gate 60 in the first type of trench 21.

A P+ body pickup region 29 is formed at the lateral side of the body region 23 adjacent to the first type of trench 21 by implementing heavily P+ impurity into the body region 23 via the contact holes 71 and 72. The P+ body pickup region 29 is near the first type of trench 21, whilst away from the second type of trench 22. A metal layer 80 is formed on the insulating layer 70. The metal layer 80 fills into the two contact holes 71 and 72, respectively to form two butting contacts, which connect the N+ source region 28, P+ body pickup region 29, and control gate 60/shielding gate 40 inside the first type of trench 21 together.

FIGS. 2-5 show alternating embodiments of the present VDMOS, which are similar to the first embodiment in structure.

Figure 2:
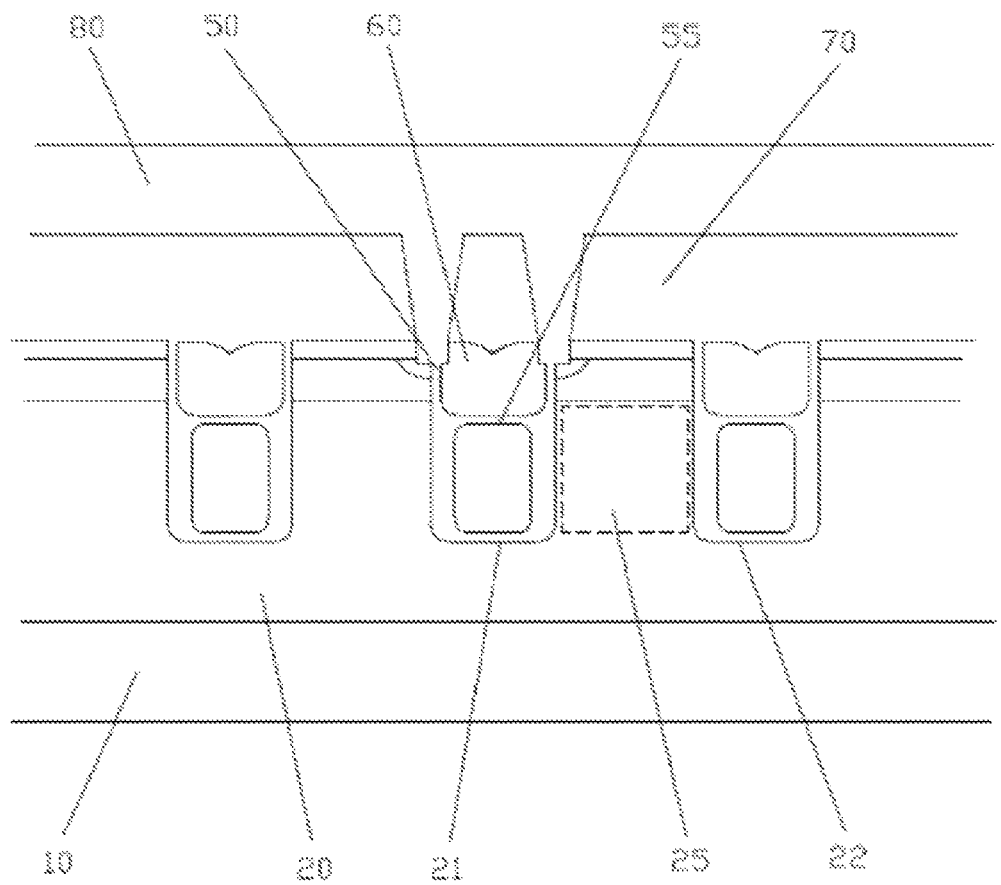
FIG. 2 shows a second embodiment of the VDMOS.

For the embodiment of FIG. 2, the VDMOS has the shielding gate 40 and control gate 60 in all of the trenches 21, 22 being isolated by the oxide layers 50, 55. The contact holes 71 and 72 extend into the control gate 60 in the first type of trench 21. The butting contacts of the metal layer 80 in the contact holes 71 and 72 connect the N+ source region 28, P+ body pickup region 29, and control gate 60 in the first type of trench 21 together.

Figure 3:
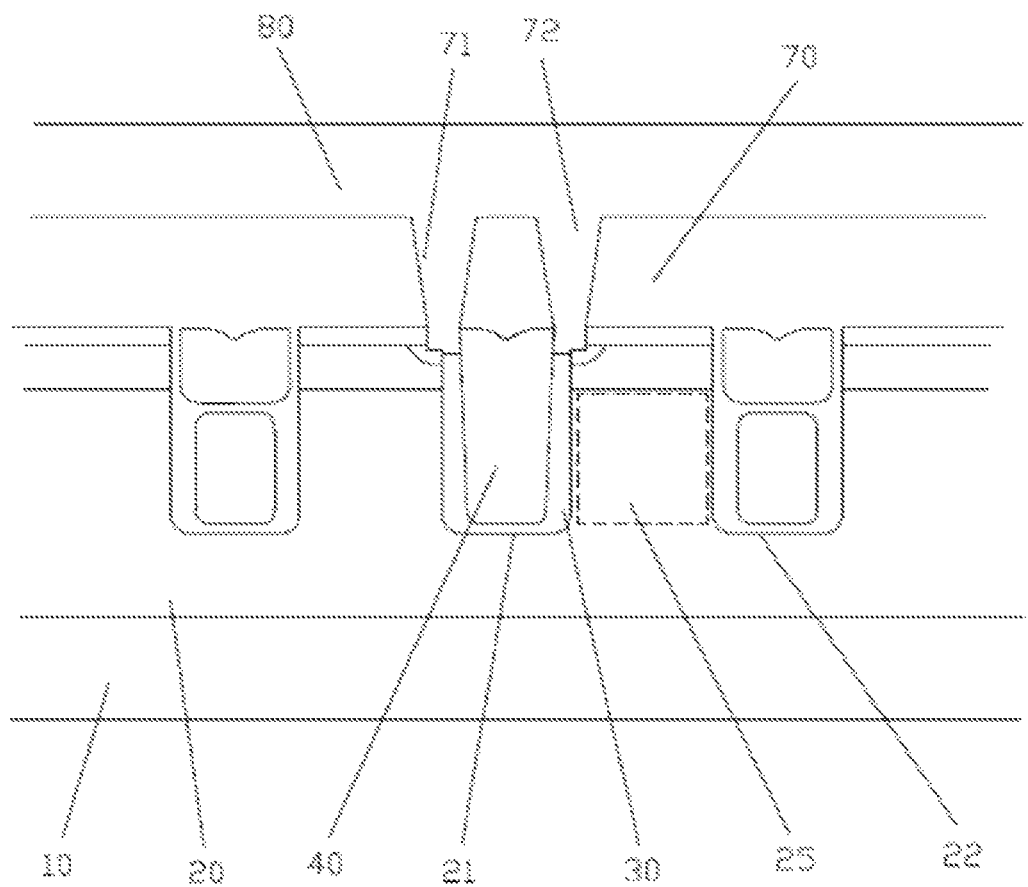
FIG. 3 shows a third embodiment of the VDMOS.
Figure 4:
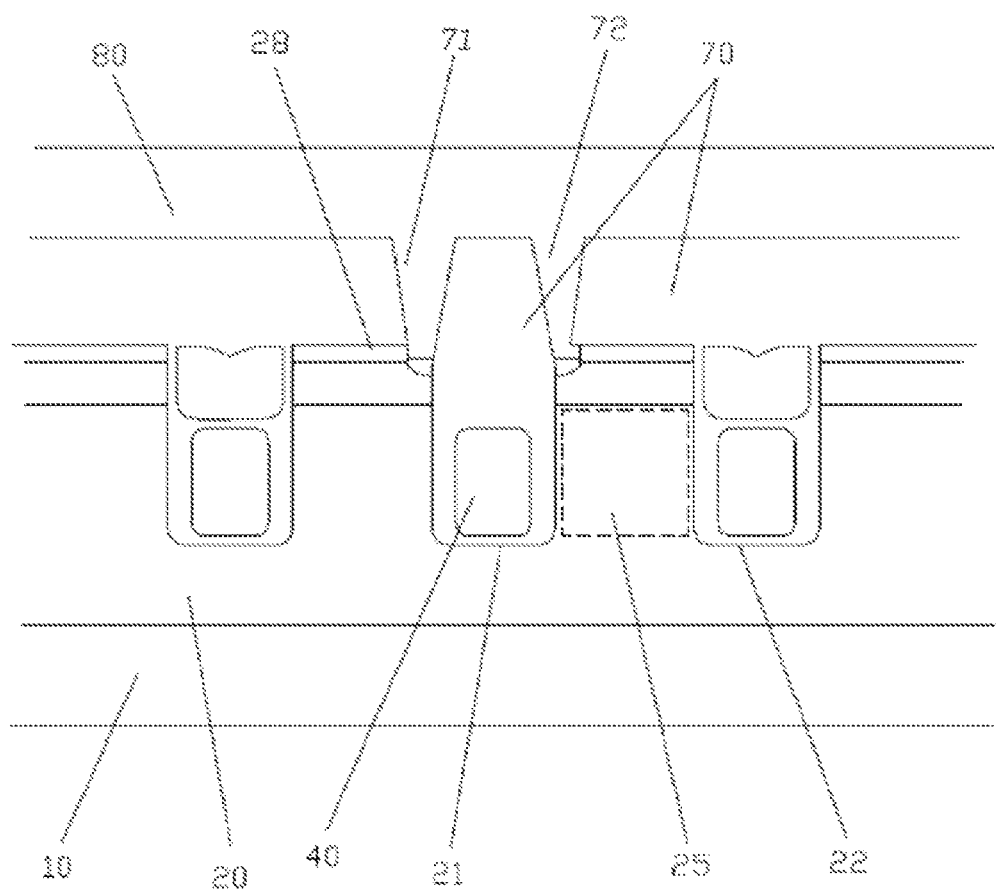
FIG. 4 shows a fourth embodiment of the VDMOS.

For the VDMOS according to the third embodiment, as shown in FIG. 3, the shielding gate 40 fills up the first type of the trench 21. The thick oxide layer 30 in the first type of the trench 21 totally covets the sidewalls, and surrounds the shielding gate 40. Accordingly, the control gate 60 is no longer formed in the first type of trench 21. The butting contacts in the contact holes 71 and 72 connect the N+ source region 28, P+ body pickup region 29, and shielding gate 40 in the first type of trench 21 together In the fourth embodiment, as shown in FIG. 4, the control gate 60 in the first type of trench 21 is replaced by an insulating oxide layer which can preferably be the same as the insulating layer 70 in material. The shielding gate 40 in the first type of trench 21 is thus totally covered. Accordingly, the butting contacts in the contact holes 71 and 72 connect the N+ source region 28 and P+ body pickup region 29 together.

Figure 5:
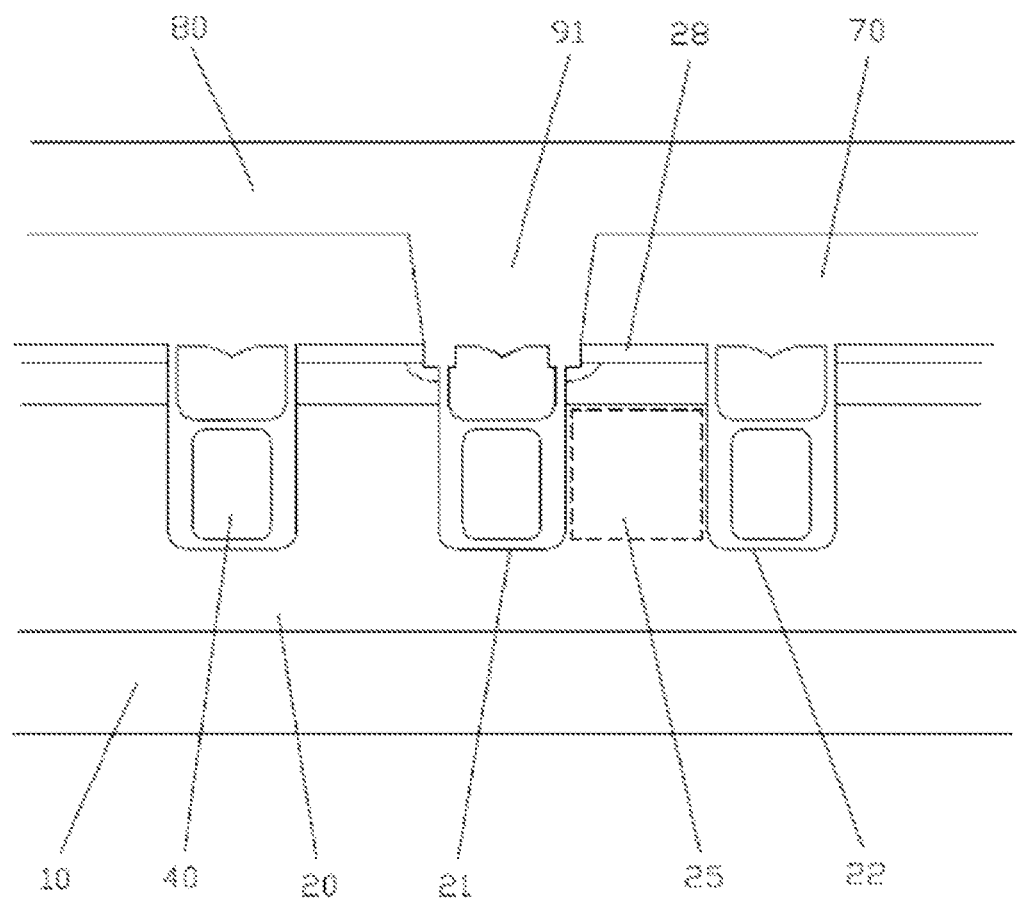
FIG. 5 shows the VDMOS according to a fifth embodiment.

Referring to FIG. 5, the VDMOS according to the fifth embodiment is different from the first embodiment in the insulating layer 70. In this embodiment, the insulating layer 70 only defines one contact hole 91. The contact hole 91 has a width larger than that of the width of the first type of trench 21, and completely overlaps the first type of trench 21. The two lateral sides of the contact hole 91 extend into the source regions 28 adjacent to the first type of trench 21. Accordingly, one butting contact in the contact hole 91 is formed and connects the N+ source region 28, P+ body pickup region 29, and control gate 60/shielding gate 40 in the first type of trench 21 together.

An example method to form the present DMOS be described in detail as follows.

Figure 6:
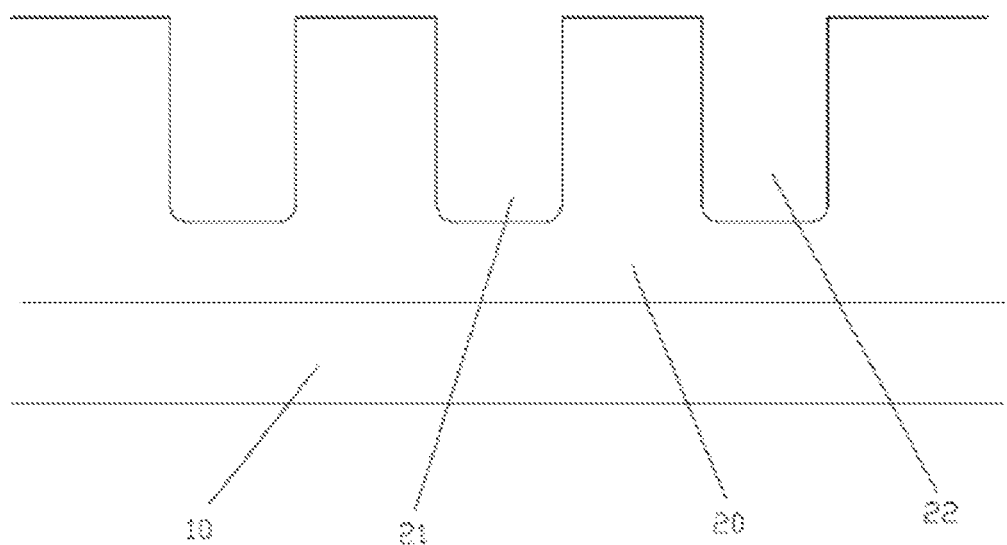
FIGS. 6-14 show steps for making the VDMOS of FIG. 1.

As shown in FIG. 6, firstly, a heavily doped N-type substrate 10 is provided and an N-type epitaxial layer 20 is grown on a surface of the substrate 10. A first mask is then used to define a trench pattern. Silicon etch is employed to etch the epitaxial layer 20 to a pre-defined depth to form the first and second types of trenches 21, 22.

Figure 7:
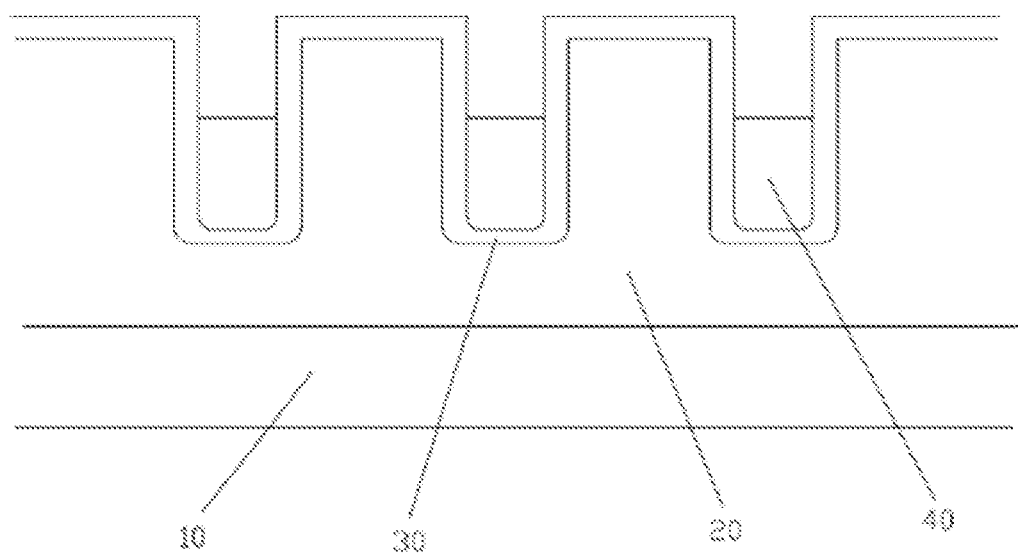

Referring to FIG. 7, a thick oxide layer 30 is then deposited on the epitaxial layer 20. The thick oxide layer 30 covers sidewalls of the trenches 21, 22. A first conductive layer 40, such as polysilicon, is then filled up the trenches 21, 22 to form the shielding gate. The first conductive layer 40 is surrounded by the thick oxide layer 30. Blanket etch is then used to remove a top portion of the conductive layer 40. A remaining bottom portion of the conductive layer 40 has a surface lower than that of the epitaxial layer 20, the bottom conductive layer 40 acts as the shielding gate.

Figure 8:
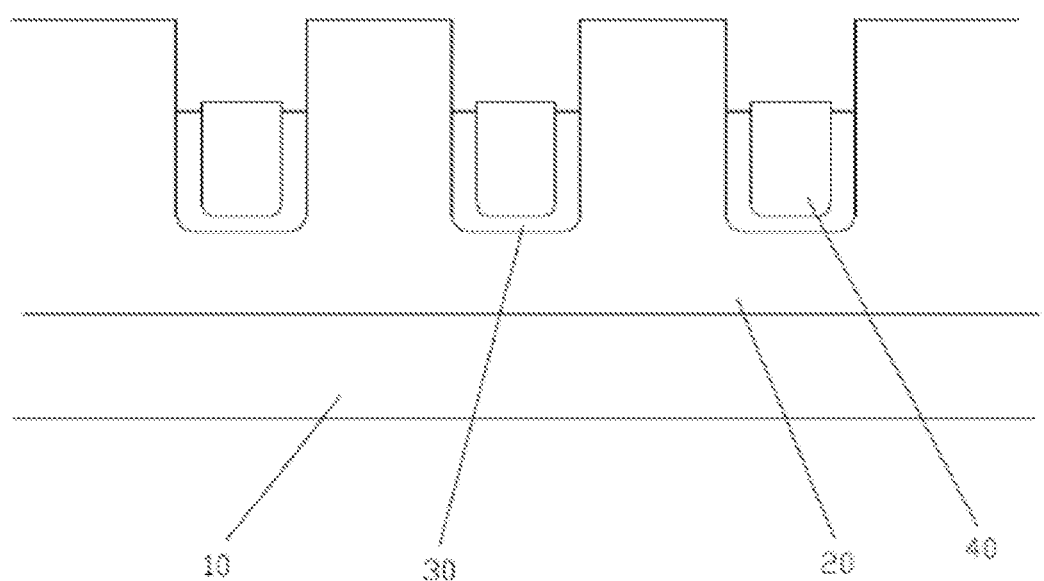

Referring to FIG. 8, the thick oxide layer 30 is then etched by wet etching. The top portion of the thick oxide layer 30 above the shielding gate 40 is removed. The etched thick oxide layer 30 has a surface not higher than that of the shielding gate 40. Accordingly, the surface of the epitaxial layer 20, and top portions of the sidewalls of the trenches 21, 22 are exposed.

For the VDMOS of the third embodiment, top portions of the first conductive layer 40 and thick oxide layer 30 in the first type of trench 21 are not removed. Thus, the shielding gate 40 fills up the first type of trench 21.

Figure 9:
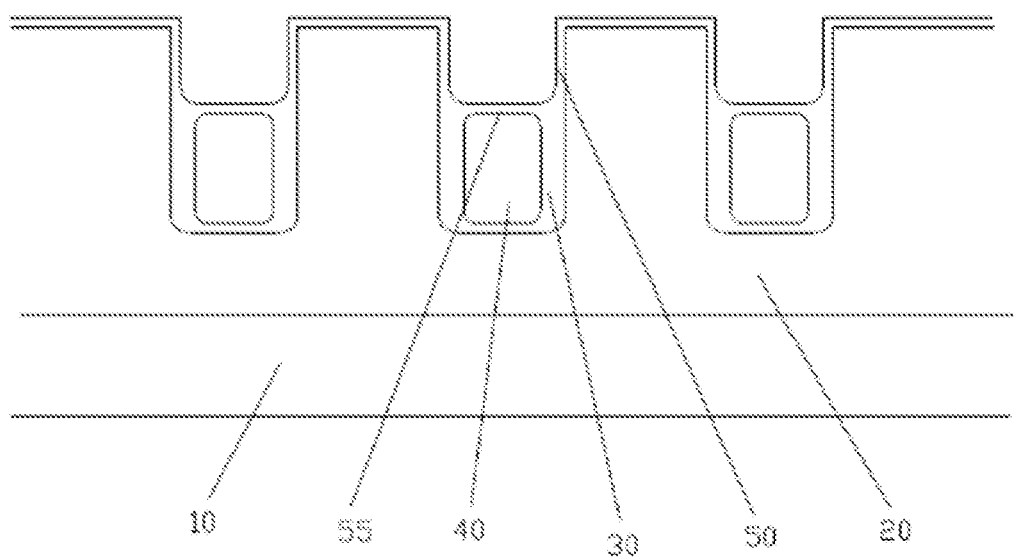

Referring to FIG. 9, an optional oxide layer 55 is then deposited on the epitaxial layer 20, and covers the exposed top portions of the sidewalls and the surface of the shielding gate 40. This optional oxide layer 55 is then etched to remove a portion thereof on the epitaxial layer 20 and the exposed sidewalls of the trenches 21, 22. A gate oxide layer 50 is then formed in the trenches 21, 22 and covers the exposed sidewalls and shielding gate 40.

Figure 10:
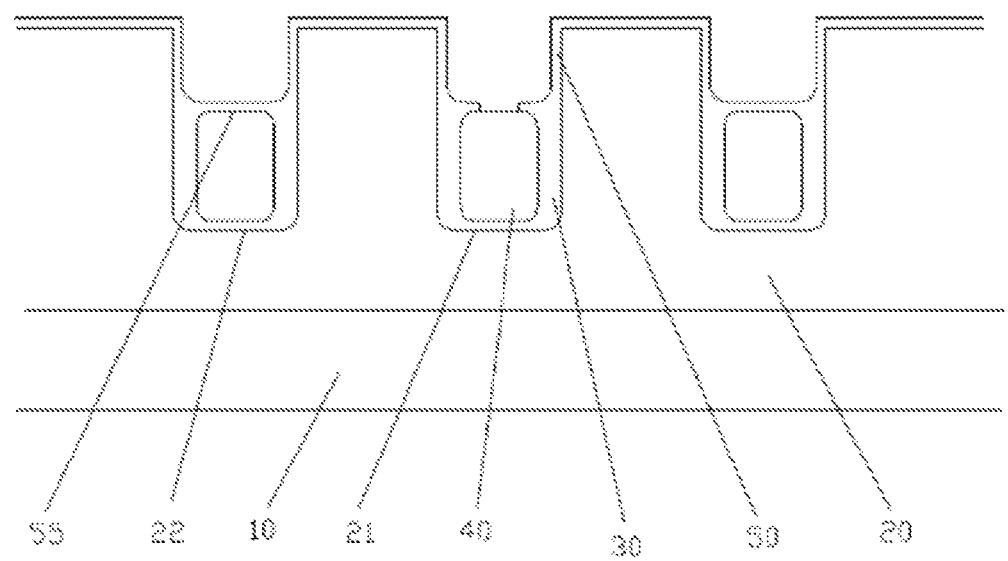

Referring to FIG. 10, a second mask is then used to remove a portion of the oxide layer 50 and optional layer 55 over the shielding gate 40 inside the first type of trench 21. For making the VDMOS of the second embodiment, this step, i.e., removing the oxide layer 50 and optional layer 55 inside the first type of trench 21 should be omitted.

Figure 11:
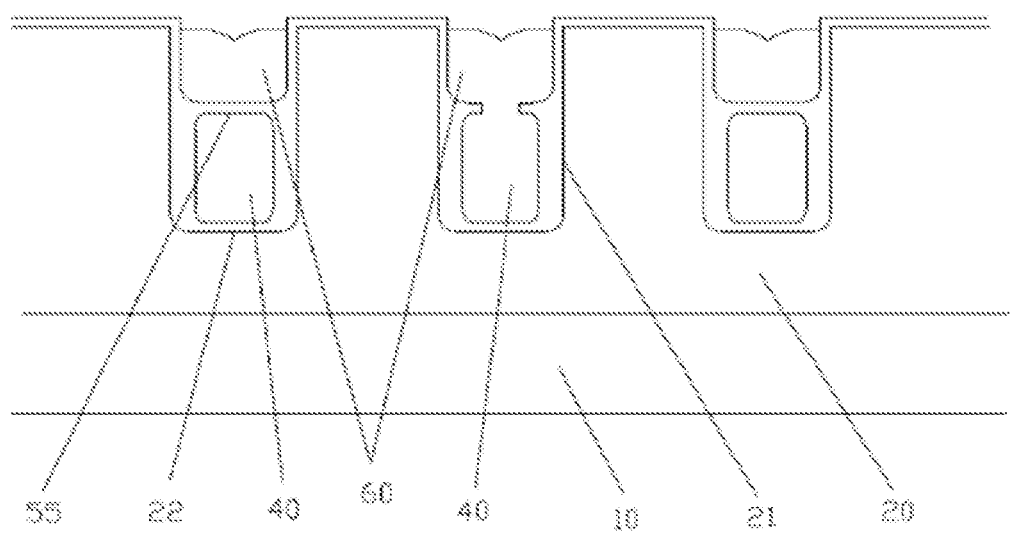

As shown in FIG. 11, a second conductive layer 60 is then used to fill up remaining tops of the first and second type of trenches 21, 22. Another blanket etch is used to remove a top portion of the second conductive layer 60 until the surface thereof being lower than that of the epitaxial layer 20, The remaining second conductive layer 60 acts as the control gate.

For the VDMOS of the fourth embodiment, the remaining top of the first type of trench 21 is filled with insulating oxide layer, rather than the second conductive layer 60. Thus, the control gate 60 is not existed in the first type of trench 21 of the VDMOS of the fourth embodiment. In addition, for the VDMOS of the third embodiment which has the shielding gate 40 filling up the first trench 21, forming the second conductive layer 60 in the first type of trench 21 is accordingly omitted.

Figure 12:
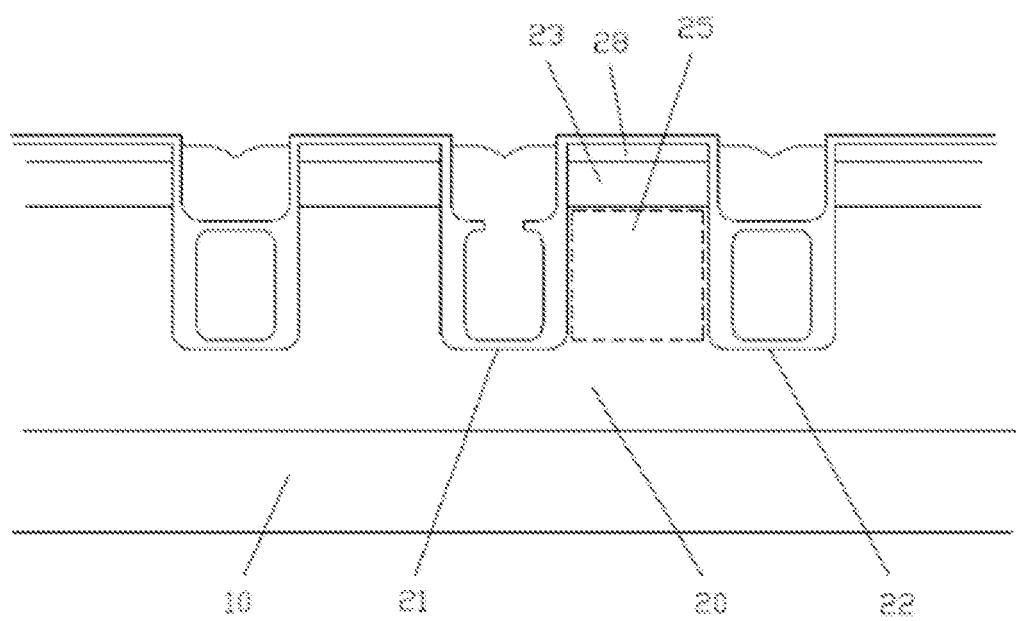

Referring to FIG. 12, a P-type body ration 23 is then formed by implanting P-type impurity into the epitaxial layer 20 and followed by drive-in process. The body region 23 is formed at the surface of the epitaxial layer 20, and between the trenches 21, 22. The body region 23 is aligned with the control gate 60 along the horizontal direction. An N+ source region 28 is formed by implanting heavily N-type impurity into the surface of the epitaxial layer 20. The N+ source region 28 is fully overlapped by the body region 23.

Multiple high energy N-type implantation and drive-in process are used to form a distinct doping region 25 in the epitaxial layer 20 under the body region 23. Preferably, the distinct doping region 25 has a bottom above that of the trenches 21, 22. The distinct doping region 25 can be formed after formation of the body region 23 or before formation of the trenches 21, 22.

Figure 13:
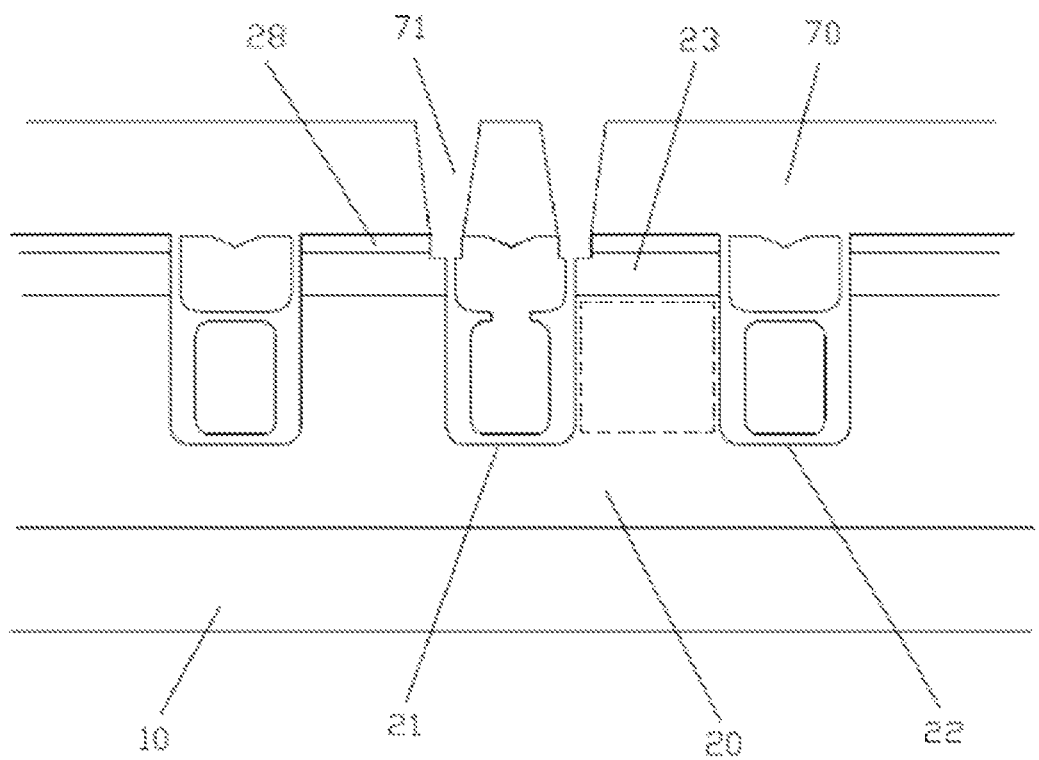

Referring to FIG. 13, an insulating layer 70 is then deposited to cover the epitaxial layer 20 and the trenches 21, 22. A contact mask is used to define two contact holes 71, 72 corresponding to two lateral sides of the first type of trench 21. For the VDMOS of the fifth embodiment, the contact bole 91 can be one in number and completely overlap the first type of trench 21. Removing the oxide in the contact holes 71, 72, the contact holes 71, 72 reach the body region 23 and the control gate 60 in the first type of trench 21. Silicon recess etch is needed to remove the N+ source region 28 inside the contact holes 71, 72.

Figure 14:
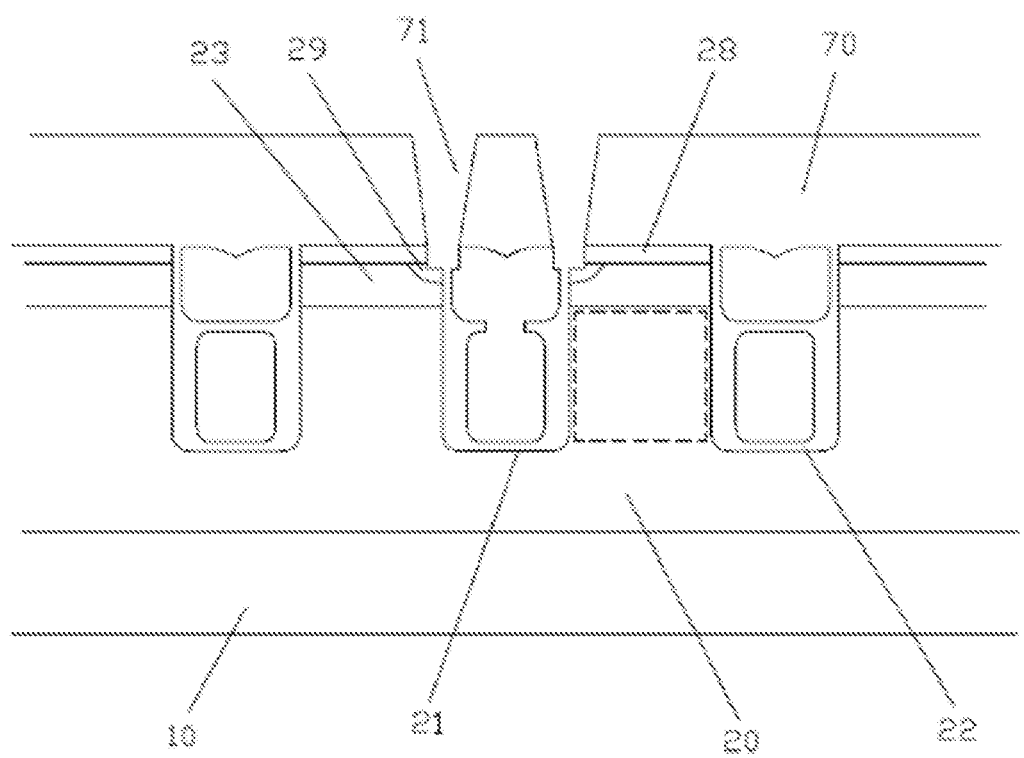

Referring to FIG. 14, P+ dopant is then implanted into the body region 23 via the contact holes 71, 72 to form a P+ body pickup region 29 near to the first type of trench 21. Finally, as shown in FIG. 1, a metal layer 80 is deposited over the insulating layer 70 and fills up the contact holes 71, 72. The metal layer 80 filled in the contact holes 71, 72 connecting the N+ source region 28, P+ body pickup region 29 and control gate 60 in the first type of trench 21 together. A metal mask is used to define the source and gate pad regions in the metal layer 80, thereby forming the present VDMOS.

Although the invention is described with reference to one or more preferred embodiments, it should be appreciated by those skilled in the arts that various modifications are possible. Therefore, the scope of the invention is to be determined by reference to the claims that follow.

We claim:

1. A VDMOS, comprising:
   a substrate, which is heavily doped, acting as a drain;
   an epitaxial layer formed on the substrate;
   a first trench and a second trench being defined in the epitaxial layer, the first trench and the second trench sitting side by side;
   a shielding gate formed in the first and second trenches;
   a body region formed at the surface of the epitaxial layer between the first and second trenches;
   a N+ source region formed at the surface of the body region;
   a distinct doping region formed in the epitaxial layer underneath the body region, the distinct doping region extending towards bottoms of the first and second trenches, and having an impurity concentration higher than the epitaxial layer;
   a channel being defined between the N+source region and epitaxial layer adjacent to the first and second trenches;
   an insulating layer covering the epitaxial layer and the first and second trenches, at least one contact hole extending through the insulating layer and the N+ source region into the body region and the first trench;
   a P+ body pickup region formed in the body region corresponding to the at least one contact hole; and
   a metal layer formed on the insulating layer, the metal layer having at least one butting contact filled in the at least one contact hole, the butting contact connecting the N+ source region, the P+ body pickup region, and the first trench;
   wherein a control gate is formed in the second trench, the control gate is over the shielding gate, and an insulating oxide layer is formed between the control gate and shielding gate in the second trench;
   wherein the shielding gate in the first trench fills up the first trench from the bottom to the mouth of the first trench and connect the insulating layer, the at least one butting contact connecting the shielding gate in the first trench.

2. The VDMOS of claim 1, wherein the first and second trenches are inside the epitaxial layer.

3. The VDMOS of claim 1, wherein the first and second trenches extend into the substrate through the epitaxial layer.

4. The VDMOS of claim 1, wherein a control gate is formed in the first trench over the shielding gate, and an insulating oxide layer is formed between the control gate and shielding gate in the first trench, the at least one butting contact connecting the control gate in the first trench.

5. The VDMOS of claim 1, wherein a control gate is formed in the first trench over the shielding gate, and the control gate and shielding gate in the first trench connect together, the at least one butting contact connecting the control gate and shielding gate in the first trench.

6. The VDMOS of claim 1, wherein an insulating oxide layer is formed in the first trench and over the shielding gate, the at least one butting contact connecting the insulating oxide layer in the first trench.

7. The VDMOS of claim 1, wherein the at least one butting contact is two in number, formed at opposite lateral sides of the first trench.

8. The VDMOS of claim 1, wherein the at least one butting contact is one in number, and lies cross the first trench.

9. A VDMOS, comprising:
   a substrate, which is heavily doped, acting as a drain;
   an epitaxial layer formed on the substrate;
   a first trench and a second trench being defined in the epitaxial layer, the first trench and the second trench sitting side by side;
   a shielding gate formed in the first and second trenches;
   a control gate being formed in the first and second trenches and cover the shielding gate, an insulating oxide layer being formed between the control gate and shielding gate in the second trench;
   a body region formed at the surface of the epitaxial layer between the first and second trenches;
   a N+ source region formed at the surface of the body region;
   a distinct doping region formed in the epitaxial layer underneath the body region, the distinct doping region extending towards bottoms of the first and second trenches, and having an impurity concentration higher than the epitaxial layer;
   a channel being defined between the N+ source region and epitaxial layer adjacent to the control gate;
   an insulating layer covering the epitaxial layer and the first and second trenches, at least one contact hole extending through the insulating layer and the N+ source region into the body region and the first trench;
   a P+ body pickup region formed in the body region corresponding to the at least one contact hole; and
   a metal layer formed on the insulating layer, the metal layer having at least one butting contact filled in the at least one contact hole, the butting contact connecting the N+ source region, P+ body pickup region, and the control gate in the first trench together;
   wherein the shielding gate in the first trench fills up the first trench from the bottom to the mouth of the first trench and connect the insulating layer, the at least one butting contact connecting the shielding gate in the first trench.

10. The VDMOS of claim 9, wherein an insulating oxide layer is formed between the control gate and shielding gate in the first trench.

11. The VDMOS of claim 9, wherein the control gate and shielding gate in the first trench connect together.

12. A method for making a VDMOS, comprising:
    providing a substrate, which is heavily doped, acting as a drain;
    forming an epitaxial layer on the substrate;
    forming a first trench and a second trench in the epitaxial layer, the first trench and the second trench sitting side by side;
    forming a shielding gate in the first and second trenches;
    forming a control gate in the first and second trenches to cover the shielding gate;
    forming an insulating oxide layer between the control gate and shielding gate in the second trench;
    forming a body region formed at the surface of the epitaxial layer between the first and second trenches;
    forming a N+ source region formed at the surface of the body region;
    forming a distinct doping region in the epitaxial layer underneath the body region, the distinct doping region extending towards bottoms of the first and second trenches, and having an impurity concentration higher than the epitaxial layer,
    forming a channel between the N+ source region and epitaxial layer adjacent to the control gate;
    forming an insulating layer to cover the epitaxial layer and the first and second trenches, forming at least one contact hole through the insulating layer and the N+ source region, the at least one contact hole extending into the body region and the first trench;

forming a P+ body pickup region in the body region corresponding to the at least one contact hole; and forming a metal layer on the insulating layer, the metal layer having at least one butting contact filled in the at least one contact hole, the butting contact connecting the N+ source region, P+ body pickup region, and the control gate in the first trench together, wherein the shielding gate in the first trench fills up the first trench from the bottom to the mouth of the first trench and connect the insulating layer, the at least one butting contact connecting the shielding gate in the first trench.

13. The method of claim 12, wherein further comprising forming an insulating layer on the shielding gate before forming the control gate.

14. The method of claim 12, wherein the insulating layer in the first trench is then removed before forming the control gate, and the control gate connects the shielding gate in the first trench.

15. The method of claim 12, wherein distinct doping region is formed after formation of the body region.

16. The method of claim 12, wherein distinct doping region is formed before formation of the first and second trenches.

\* \* \* \* \*